United States Patent
Lee et al.

(10) Patent No.: US 10,886,253 B2
(45) Date of Patent: Jan. 5, 2021

(54) SEMICONDUCTOR PACKAGE

(71) Applicant: SAMSUNG ELECTRONICS CO., LTD., Suwon-si (KR)

(72) Inventors: Saet Byeol Lee, Cheonan-si (KR); You Kyung Son, Cheonan-si (KR); Seung Lo Lee, Asan-si (KR); Won Gil Han, Cheongju-si (KR); Ho Soo Han, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 29 days.

(21) Appl. No.: 16/379,969

(22) Filed: Apr. 10, 2019

(65) Prior Publication Data

US 2020/0066678 A1 Feb. 27, 2020

(30) Foreign Application Priority Data

Aug. 24, 2018 (KR) .................. 10-2018-0099332

(51) Int. Cl.
*H01L 25/065* (2006.01)
*H01L 23/31* (2006.01)
*H01L 23/00* (2006.01)
*H01L 21/56* (2006.01)

(52) U.S. Cl.
CPC ........ *H01L 25/0652* (2013.01); *H01L 21/565* (2013.01); *H01L 23/3121* (2013.01); *H01L 24/09* (2013.01); *H01L 24/17* (2013.01); *H01L 24/33* (2013.01); *H01L 24/49* (2013.01); *H01L 24/73* (2013.01); *H01L 2224/73207* (2013.01); *H01L 2224/73253* (2013.01)

(58) Field of Classification Search
CPC ..... H01L 25/0642; H01L 24/09; H01L 24/17; H01L 24/49; H01L 24/73; H01L 23/3121; H01L 21/565; H01L 24/33; H01L 2224/73207
USPC ......... 257/690, 686, 784; 438/109, 617, 618
See application file for complete search history.

(56) References Cited

U.S. PATENT DOCUMENTS

| | | |
|---|---|---|
| 6,977,439 B2 | 12/2005 | Kang et al. |
| 7,192,861 B2 | 3/2007 | Ano |
| 7,262,124 B2 | 8/2007 | Fujisawa |
| 7,547,626 B2 | 6/2009 | Kwak |
| 7,821,140 B2 | 10/2010 | Mii et al. |

(Continued)

FOREIGN PATENT DOCUMENTS

| | | |
|---|---|---|
| JP | 2012-99556 A | 5/2012 |
| JP | 2013-171913 A | 9/2013 |
| KR | 10-2013-0096723 A | 8/2013 |

*Primary Examiner* — Thinh T Nguyen
(74) *Attorney, Agent, or Firm* — Sughrue Mion, PLLC

(57) ABSTRACT

A semiconductor package is provided. The semiconductor package includes: a mounting substrate including at least one bonding pad; a first semiconductor chip disposed on the mounting substrate, and including a first protrusion on one side of the first semiconductor chip; a first spacer ball electrically connected to the first semiconductor chip; a first bump ball electrically connected to the first spacer ball; and a first wire which electrically connects the first bump ball and the bonding pad without contacting the first protrusion, wherein the first wire includes a first portion extending in a direction away from the bonding pad, and a second portion extending in a direction approaching the bonding pad.

20 Claims, 17 Drawing Sheets

(56) References Cited

U.S. PATENT DOCUMENTS

| | | |
|---|---|---|
| 9,263,418 B2 | 2/2016 | Kasuya et al. |
| 9,812,423 B2 | 11/2017 | Fukue |
| 2006/0290744 A1 | 12/2006 | Lee et al. |
| 2009/0001608 A1 | 1/2009 | Mii et al. |
| 2009/0020872 A1 | 1/2009 | Mii et al. |
| 2010/0295180 A1 | 11/2010 | Tzu |
| 2012/0038059 A1 | 2/2012 | Chin et al. |
| 2013/0020730 A1* | 10/2013 | Kim et al. .......... H01L 23/3135 257/690 |

\* cited by examiner

SEMICONDUCTOR PACKAGE

CROSS-REFERENCE TO THE RELATED APPLICATION

This application claims priority from Korean Patent Application No. 10-2018-0099332, filed on Aug. 24, 2018, the disclosure of which is incorporated herein by reference in its entirety.

BACKGROUND

1. Field

Apparatuses and methods consistent with the exemplary embodiments of the inventive concept relate to a semiconductor package including a folded loop and a normal loop.

2. Description of the Related Art

Recently, the size of semiconductor chips has been increased while requiring implementation of high-performance elements. Further, in order to satisfy multi-functionalization and high capacity of a semiconductor package, a multi-chip semiconductor package in which a plurality of semiconductor chips are stacked in one package is developed.

However, with slimming-down of electronic devices in which semiconductor packages are used, the size of semiconductor packages tends to decrease. In order to satisfy such a tendency of downsizing of electronic devices, various researches on a method capable of reducing the size of a semiconductor package are being conducted.

SUMMARY

Various embodiments of the inventive concept provide a miniaturized semiconductor package with improved product reliability.

However, the inventive concept is not restricted to these embodiments described herein, and instead, various other embodiments will become apparent to one of ordinary skill in the art to which the inventive concept pertains by referencing the detailed description of these embodiments.

According to some embodiments of the inventive concept, there is provided a semiconductor package which may include: a mounting substrate including at least one bonding pad; a first semiconductor chip disposed on the mounting substrate, and including a first protrusion on one side of the first semiconductor chip; a first spacer ball electrically connected to the first semiconductor chip; a first bump ball electrically connected to the first spacer ball; and a first wire which electrically connects the first bump ball and the bonding pad without contacting the first protrusion, wherein the first wire includes a first portion extending in a direction away from the bonding pad, and a second portion extending in a direction approaching the bonding pad.

According to some embodiments of the inventive concept, there is provided a semiconductor package which may include: at least one bonding pad; a first semiconductor chip including a first chip pad connected to the bonding pad, and a first protrusion protruding from an upper surface of the first chip pad; a first spacer ball on the first chip pad; a first bump ball on the first spacer ball; a first wire which connects the first bump ball and the bonding pad without contacting the first protrusion; a second semiconductor chip disposed on the first semiconductor chip, and including a second chip pad connected to the bonding pad, and a second protrusion protruding from an upper surface of the second chip pad; a second bump ball directly connected to the second chip pad; and a second wire which connects the second bump ball and the bonding pad without contacting the second protrusion, wherein the first wire includes a first portion extending in a direction away from the bonding pad, and a second portion extending in a direction approaching the bonding pad, and the second wire does not extend in the direction away from the bonding pad.

According to some embodiments of the inventive concept, there is provided a semiconductor package which may include: a mounting substrate including at least one bonding pad; a first semiconductor chip disposed on the mounting substrate, and including a first chip pad and a first protrusion protruding from the first chip pad; a second semiconductor chip disposed on the first semiconductor chip, and including a second chip pad and a second protrusion protruding from the second chip pad; a third semiconductor chip disposed on the second semiconductor chip, and including a third chip pad and a third protrusion protruding from the third chip pad; and a first wire, a second wire and a third wire connecting of the first to third chip pads to the bonding pad, respectively, wherein the second wire is connected to the second chip pad by a second spacer ball disposed on the second chip pad and a second bump ball disposed on the second spacer ball, wherein the first chip pad and the third chip pad do not overlap the second semiconductor chip in a vertical direction, wherein the second chip pad overlaps the first semiconductor chip and the third semiconductor chip in the vertical direction, and wherein the second wire includes a first portion extending in a direction away from the bonding pad, and a second portion extending in a direction approaching the bonding pad.

BRIEF DESCRIPTION OF THE DRAWINGS

The above and other aspects and features of the inventive concept will become more apparent by describing in detail exemplary embodiments thereof with reference to the attached drawings, in which.

DETAILED DESCRIPTION OF THE EXEMPLARY EMBODIMENTS

The embodiments presented herein are all exemplary which do not restrict the inventive concept. An embodiment provided in the following description is not excluded from being associated with one or more features of another example or another embodiment also provided herein or not provided herein but consistent with the inventive concept. For example, even if matters described in a specific example are not described in a different example thereto, the matters may be understood as being related to or combined with the different example, unless otherwise mentioned in descriptions thereof.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Figure 1:
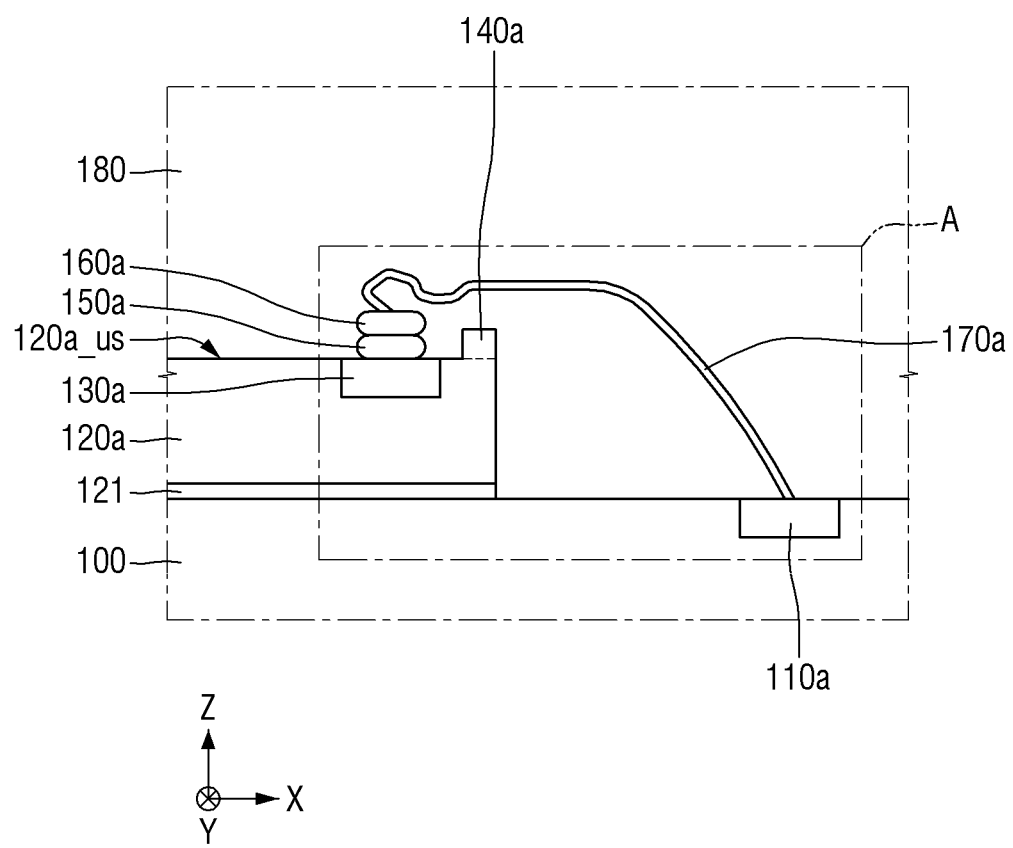
FIG. 1 is an exemplary diagram for illustrating a semiconductor package according to some embodiments.

FIG. 1 is an exemplary diagram for illustrating a semiconductor package according to some embodiments.

Referring to FIG. 1, the semiconductor package may include a mounting substrate 100, a first semiconductor chip 120a, a first adhesive film 121, a first spacer ball 150a, a first bump ball 160a, a first wire 170a, and a first molding resin 180.

The first semiconductor chip 120a may be disposed on the mounting substrate 100. The first adhesive film 121 may be disposed between the first semiconductor chip 120a and the mounting substrate 100. For example, the first semiconductor chip 120a may be fixed to the mounting substrate 100 by the first adhesive film 121. The first adhesive film 121 may be, for example, a Die Attach Film (DAF).

The mounting substrate 100 may include a first bonding pad 110 on a surface on which the first semiconductor chip 120a is disposed. The first semiconductor chip 120a may include a first chip pad 130a on a surface opposite to a surface connected to the mounting substrate 100.

The first spacer ball 150a may be disposed on the first semiconductor chip 120a. For example, the first spacer ball 150a may be connected to the first chip pad 130a of the first semiconductor chip 120a. The first bump ball 160a may be disposed on the first spacer ball 150a. For example, the first bump ball 160a may be connected to the first spacer ball 150a.

The first wire 170a may electrically connect the first semiconductor chip 120a and the mounting substrate 100. For example, the first wire 170a may connect the first chip pad 130a of the first semiconductor chip 120a and the first bonding pad 110a of the mounting substrate 100, thereby electrically connecting the first semiconductor chip 120a and the mounting substrate 100.

The first molding resin 180 may be formed on the mounting substrate 100 to cover the first semiconductor chip 120a, the first adhesive film 121, the first bonding pad 110a, the first spacer ball 150a, the first bump ball 160a and the first wire 170a. The first molding resin 180 may protect the internal constituent elements of the semiconductor package. For example, the first molding resin 180 may prevent or reduce an external shock from being transmitted to the mounting substrate 100, the first semiconductor chip 120a, the first adhesive film 121, the first bonding pad 110a, the first spacer ball 150a, the first bump ball 160a and the first wire 170a. The first molding resin 180 may be, for example, an epoxy molding compound (EMC), but the embodiments are not limited thereto.

According to some embodiments, the mounting substrate 100 may be a packaging substrate, and may be, for example, a printed circuit board (PCB), a ceramic substrate or the like. On a lower surface of the mounting substrate 100, that is, on a surface opposite to the mounting surface on which the first semiconductor chip 120a is disposed, an external terminal (for example, a solder ball or a lead frame) which electrically connects the semiconductor package to the external device may be formed. The first bonding pad 110a may be electrically connected to an external terminal connected to the external device, and may supply an electrical signal to the first semiconductor chip 120a. Alternatively, the first bonding pad 110a may be, for example, a ground pad and may be electrically connected to a ground line in the mounting substrate 100. The first bonding pad 110a is illustrated, for example, as being disposed in an outer shell of the mounting substrate 100, but the embodiments are not limited thereto.

According to some embodiments, the first semiconductor chip 120a may be, for example, a memory chip, a logic chip, or the like. When the first semiconductor chip 120a is a logic chip, various designs may be made in consideration of operations to be performed. When the first semiconductor chip 120a is a memory chip, the memory chip may be, for example, a non-volatile memory chip. For example, the first semiconductor chip 120a may be a flash memory chip. For example, the first semiconductor chip 120a may be one of a NAND flash memory chip and a NOR flash memory chip. However, the form of the memory device according to the technical idea of the inventive concept is not limited thereto. In some embodiments, the first semiconductor chip 120a may be one of a phase-change random access memory (PRAM), a magneto-resistive random access memory (MRAM), and a resistive random access memory (RRAM).

According to some embodiments, the first chip pad 130a of the first semiconductor chip 120a may be electrically connected to the semiconductor element inside the first semiconductor chip 120a. Therefore, the electric signal received by the first bonding pad 110a may be transmitted to the first chip pad 130a of the first semiconductor chip 120a by the first wire 170a. The electric signal transmitted to the first chip pad 130a of the first semiconductor chip 120a may be transmitted to the semiconductor element inside the first semiconductor chip 120a.

According to some embodiments, the first semiconductor chip 120a may include a first protrusion 140a. The first protrusion 140a may include a portion protruding in a vertical direction z from an upper surface 120a_us of the first semiconductor chip. In some drawings, the first protrusion 140a is illustrated as being a rectangular portion protruding in the vertical direction z from the upper surface 120a-us of the first semiconductor chip, but the embodiments are not limited thereto. For example, the first protrusion 140a may have various shapes such as a triangular shape or a tilted triangular shape. The process of generating the first protrusion 140a of the first semiconductor chip 120a will be described with reference to FIGS. 2, 3a, and 3b.

Figure 2:
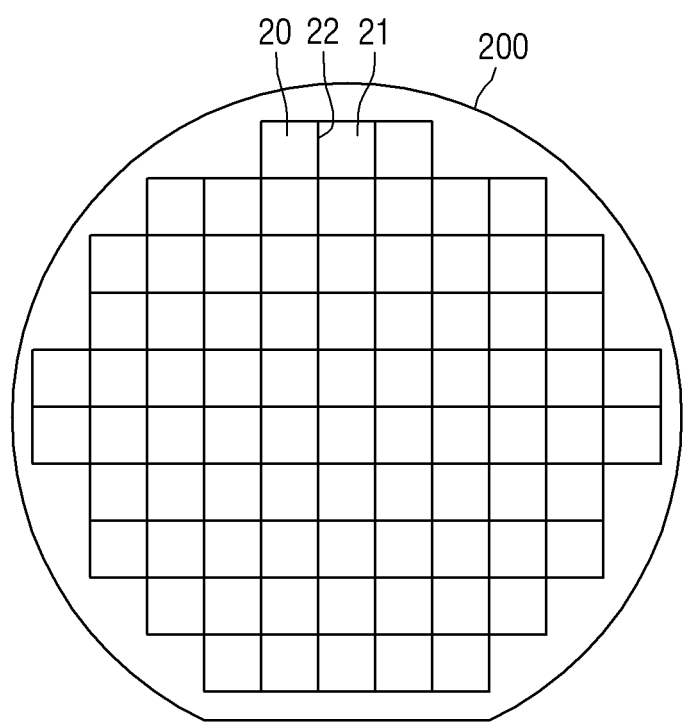
FIG. 2 is an exemplary diagram for describing a wafer including a semiconductor chip region according to some embodiments.
Figure 3A:
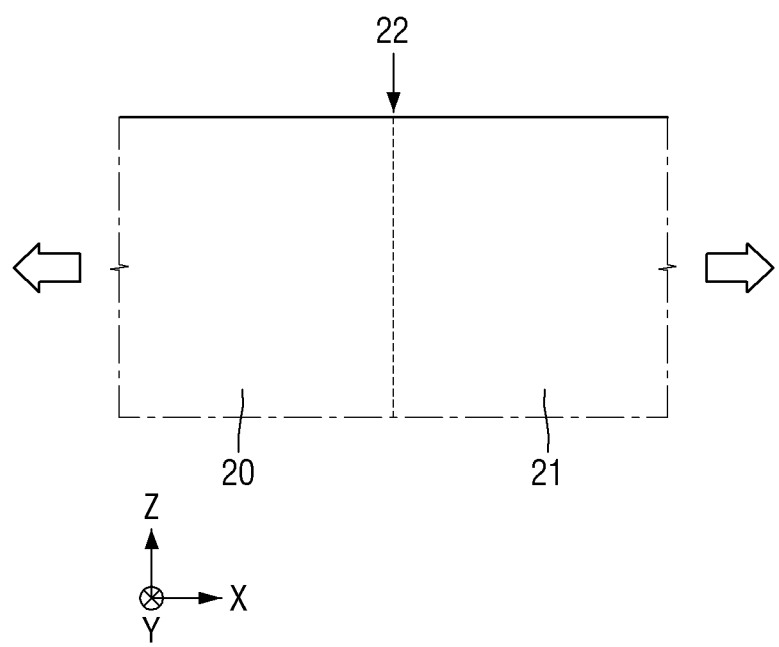
FIGS. 3A and 3B are illustrative diagrams for explaining a process of forming a protrusion of a semiconductor chip according to some embodiments.
Figure 3B:
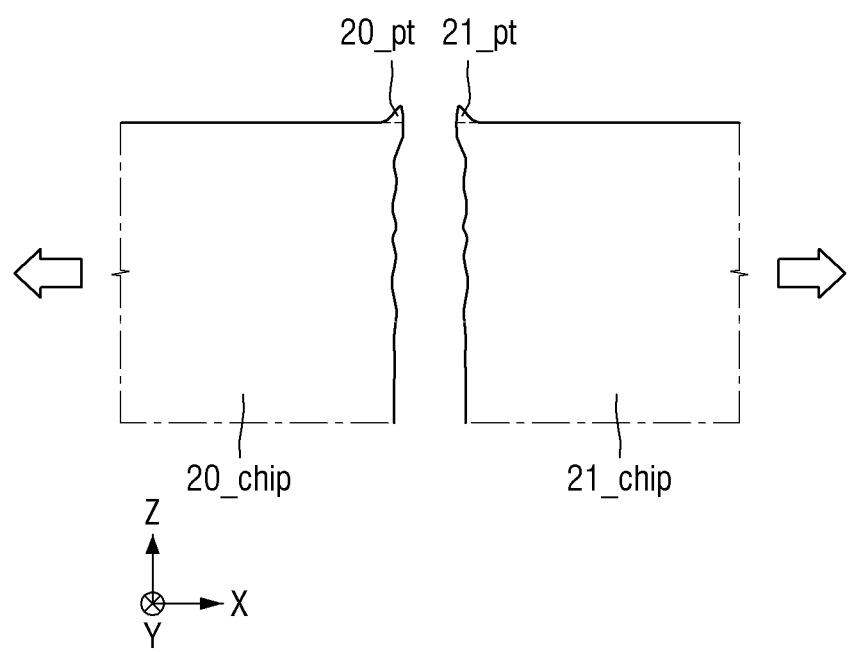

FIG. 2 is an exemplary diagram for describing a wafer including the semiconductor chip region according to some embodiments. FIGS. 3A and 3B are illustrative diagrams for explaining a process of forming protrusions of the semiconductor chip according to some embodiments.

Referring to FIG. 2, the wafer 200 may include a first semiconductor chip region 20 and a second semiconductor chip region 21. For example, the first semiconductor chip region 20 and the second semiconductor chip region 21 may be arranged on the wafer 200 in planar directions x, y. A cutting region 22 may be disposed between the first semiconductor chip region 20 and the second semiconductor chip region 21. Each of the first semiconductor chip region 20 and the second semiconductor chip region 21 may include an internal circuit required for driving the semiconductor chip.

Referring to FIGS. 3A and 3B, by separating the first semiconductor chip region 20 and the second semiconductor chip region 21 along the cutting region 22, the respective semiconductor chips (20_chip, 21_chip) may be generated. For example, the first semiconductor chip region 20 and the second semiconductor chip region 21 may be separated in the x direction and in the −x direction on the basis of the cutting region 22. The semiconductor chips (20_chip, 21_chip) formed by separating the first semiconductor chip region 20 and the second semiconductor chip region 21 may include protrusions 20_pt, 21_pt, respectively. At this time, the protrusions 20_pt, 21_pt may be generated due to the characteristics of a material constituting the semiconductor chips (20_chip, 21_chip). Alternatively, the protrusions 20_pt, 21_pt may be generated due to an external stress generated when separating the first semiconductor chip region 20 and the second semiconductor chip region 21 along the cutting region 22. However, the embodiments are not limited to these causes of generating the protrusions 20_pt, 21_pt. Each of the semiconductor chips (20_chip, 21_chip) may include protrusions 20_pt, 21_pt due to various causes, in addition to the above-described causes.

Referring again to FIG. 1, the first wire 170a may include, for example, gold, copper, aluminum, or the like. The first wire 170a may be formed by, for example, a capillary, but the embodiments are not limited thereto. An example of the process of forming the first wire 170a will be described later.

According to some embodiments, the first wire 170a may be formed as a folded loop having a hook shape. The hook shape means a shape including a portion extending in a direction away from the first bonding pad 110a and a portion extending in a direction approaching the first bonding pad 110a. The folded loop means that the wire adjacent to a portion in which the first wire 170a is connected to the first bump ball 160a has a wrinkled shape. The description will be provided with reference to FIG. 4 for illustrative explanation.

Figure 4:
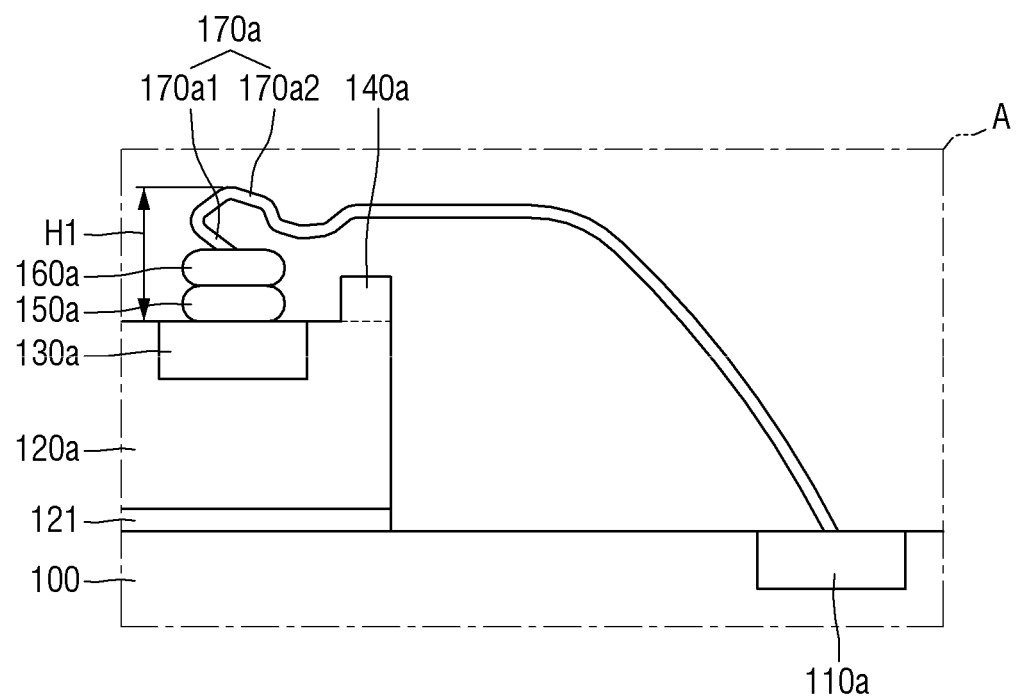
FIG. 4 is an enlarged view illustrating a region A of FIG. 1 in an enlarged manner according to some embodiments.

FIG. 4 is an enlarged view illustrating a region A of FIG. 1 in an enlarged manner.

Referring to FIG. 4, the first wire 170a may include a first portion 170a1 extending in a direction away from the first bonding pad 110a, and a second portion 170a2 extending in a direction approaching the first bonding pad 110a. In other words, the first wire 170a may have a hook shape. Further, the first wire 170a may have a shape in which a portion adjacent to the portion connected to the first bump ball 160a is wrinkled downward. In other words, the first wire 170a may be formed as a folded loop having a hook shape.

According to some embodiments, since the first wire 170a is formed as a folded loop, a height H1 of the first wire may be smaller than the height of a general bonding wire. In a case where another semiconductor chip is vertically stacked on the first semiconductor chip 120a, since the height H1 of the first wire is smaller than the height of the general bonding wire, more chips may be stacked in the same region. Therefore, by forming the first wire 170a as a folded loop, the semiconductor package can be miniaturized.

According to some embodiments, the first wire 170a does not come into contact with the first protrusion 140a of the first semiconductor chip 120a. When the first wire 170a comes into contact with the first protrusion 140a of the first semiconductor chip 120a, a defective operation of the first semiconductor chip 120a may occur. Therefore, according to some embodiments, by inserting the first spacer ball 150a between the first bump ball 160a and the first chip pad 130a of the first semiconductor chip 120a, it is possible to prevent short-circuit between the first wire 170a and the first protrusion 140a of the first semiconductor chip 120a. The height of the first spacer ball 150a may be changed on the basis of the height of the first protrusion 140a.

According to some embodiments, since the first wire 170a is not in contact with the first protrusion 140a of the first semiconductor chip 120a, reliability of the semiconductor package can be improved. In addition, since the height H1 of the first wire is reduced and more semiconductor chips may be stacked, the degree of integration of the semiconductor package can be improved.

Figure 5:
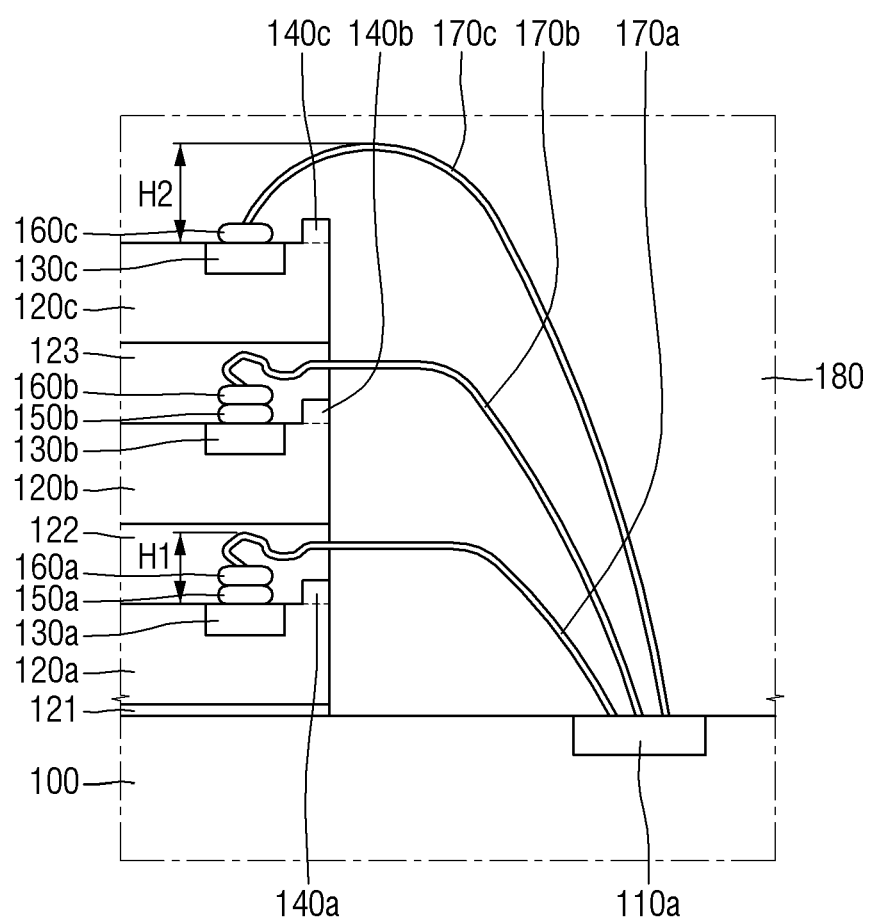
FIG. 5 is an exemplary diagram illustrating a semiconductor package in which semiconductor chips according to some embodiments are stacked vertically.

FIG. 5 is an exemplary diagram illustrating a semiconductor package in which semiconductor chips according to some embodiments are stacked vertically.

Referring to FIG. 5, the semiconductor package according to some embodiments may include a mounting substrate 100, a first semiconductor chip 120a, a second semiconductor chip 120b, a third semiconductor chip 120c, a first spacer ball 150a, a second spacer ball 150b, a first bump ball 160a, a second bump ball 160b, a third bump ball 160c, a first wire 170a, a second wire 170b, a third wire 170c, a first adhesive film 121, a second adhesive film 122, a third adhesive film 123, and a molding resin 180.

Each of the constituent elements illustrated in FIG. 5 may be similar to those of FIG. 1 described above. Therefore, repeated descriptions will be omitted or briefly explained. According to some embodiments, the first semiconductor chip 120a may include a first chip pad 130a and a first protrusion 140a protruding from the upper surface 120a us of the first semiconductor chip. The second semiconductor chip 120b may include a second chip pad 130b and a second protrusion 140b protruding from the upper surface of the second semiconductor chip 120b. The third semiconductor chip 120c may include a third chip pad 130c and a third protrusion 140c protruding from the upper surface of the third semiconductor chip 120c.

The first semiconductor chip 120a may be disposed on the mounting substrate 100. For example, the first semiconductor chip 120a may be attached to the mounting substrate 100 via the first adhesive film 121.

The first spacer ball 150a may be connected to the first chip pad 130a of the first semiconductor chip 120a. The first bump ball 160a may be connected to the first spacer ball 150a. The first wire 170a may be connected to the first bump ball 160a and the first bonding pad 110a. In other words, the first chip pad 130a and the first bonding pad 110a may be electrically connected by the first wire 170a. That is, the first semiconductor chip 120a and the mounting substrate 100 may be electrically connected to each other via the first wire 170a. In some embodiments, the first wire 170a may be formed as a folded loop having a hook shape.

According to some embodiments, the first wire 170a is not in contact with the first protrusion 140a of the first semiconductor chip 120a. Also, the first wire 170a is not in contact with the second semiconductor chip 120b. When the first wire 170a is in contact with the first protrusion 140a of the first semiconductor chip 120a and the second semiconductor chip 120b, a defective operation may occur in the semiconductor package. Therefore, according to some embodiments, by inserting the first spacer ball 150a between the first bump ball 160a and the first chip pad 130a of the first semiconductor chip 120a with forming the first wire 170a as a folded loop having a hook shape, it is possible to prevent the first wire 170a from being short-circuited to the first protrusion 140a of the first semiconductor chip 120a and the second semiconductor chip 120b. The height of the first spacer ball 150a may be changed considering the height of the first protrusion 140a and the distance between the first semiconductor chip 120a and the second semiconductor chip 120b.

According to some embodiments, since the first wire 170a is not in contact with the first protrusion 140a of the first semiconductor chip 120a and the second semiconductor chip 120b, reliability of the semiconductor package can be improved. In addition, since the height H1 of the first wire is reduced and more semiconductor chips may be stacked, the degree of integration of the semiconductor package may be improved.

The second semiconductor chip 120b may be arranged on the first semiconductor chip 120a. For example, the second semiconductor chip 120b may be attached to the first semiconductor chip 120a via the second adhesive film 122. In other words, the second adhesive film 122 may be disposed between the first semiconductor chip 120a and the second semiconductor chip 120b.

The first adhesive film 121 and the second adhesive film 122 may be, for example, a Die Attach Film (DAF), and may be a material into which the wire may penetrate. The thicknesses of the first adhesive film 121 and the second adhesive film 122 may be different depending on the positions to be attached. The adhesive film into which the wire penetrates, e.g., the second adhesive film 122 into which the first wire 170a penetrates, may be, for example, thicker than the first adhesive film 121 so that the first wire 170a may be protected. Here, the expression "the wire penetrates into the adhesive film" means that even if the adhesive film is disposed on the wire, since the adhesive film surrounds the wire, the shape of the wire is maintained unchanged.

The second spacer ball 150b may be connected to the second chip pad 130b of the second semiconductor chip 120b. The second bump ball 160b may be connected to the second spacer ball 150b. The second wire 170b may be connected to the second bump ball 160b and the first bonding pad 110a. In other words, the second chip pad 130b and the first bonding pad 110a may be electrically connected to each other by the second wire 170b. That is, the second semiconductor chip 120b and the mounting substrate 100 may be electrically connected to each other via the second wire 170b. The second wire 170b may be formed as a folded loop having a hook shape. In the same way as described above, the second wire 170b is not brought into contact with the second protrusion 140b of the second semiconductor chip 120b and the third semiconductor chip 120c.

The third semiconductor chip 120c may be disposed on the second semiconductor chip 120b. For example, the third semiconductor chip 120c may be attached to the second semiconductor chip 120b via the third adhesive film 123. In other words, the third adhesive film 123 may be disposed between the second semiconductor chip 120b and the third semiconductor chip 120c. The third adhesive film 123 may also be a DAF.

The third bump ball 160c may be directly connected to the third chip pad 130c of the third semiconductor chip 120c. In other words, a spacer ball may not be arranged on the third semiconductor chip 120c. The third wire 170c may be connected to the third bump ball 160c and the first bonding pad 110a. In other words, the third chip pad 130c and the first bonding pad 110a may be electrically connected to each other by the third wire 170c. The third wire 170c may be formed as a normal loop. In some embodiments, the normal loop may be in a wrinkle-free form. In addition, when the third wire 170c does not extend in a direction away from the first bonding pad 110a, the third wire 170c may be referred to as a normal loop. The normal loop according to some embodiments may be a forward loop or a reverse loop. When a start point of the wire bonding is a chip pad of a semiconductor chip, the loop is referred to as a forward loop. On the other hand, when the start point of the wire bonding is a bonding pad of a mounting substrate, the loop is referred to as a reverse loop. According to some embodiments, the third wire 170c is not in contact with the third protrusion 140c of the third semiconductor chip 120c.

According to some embodiments, in the case of the third semiconductor chip 120c, another semiconductor chip may no longer be stacked on the top thereof. Therefore, the third semiconductor chip 120c may be connected to the first bonding pad 110a by the third wire 170c having the form of the normal loop. In some embodiments, a height H2 of the third wire may be higher than the height H1 of the first wire. Therefore, even if a spacer ball is not formed on the third the chip pad 130c of the third semiconductor chip 120c, the third wire 170c may not be in contact with the third protrusion 140c.

The first chip pad 130a of the first semiconductor chip 120a, the second chip pad 130b of the second semiconductor chip 120b, and the third chip pad 130c of the third semiconductor chip 120c are electrically connected to semiconductor elements inside the first semiconductor chip 120a, the second semiconductor chip 120b, and the third semiconductor chip 120c, respectively. Since the first chip pad 130a, the second chip pad 130b and the third chip pad 130c are electrically connected to the first bonding pad 110a, the first chip pad 130a, the second chip pad 130b and the third chip pad 130c need to be pads that perform a same role in the respective semiconductor chips. Therefore, the first semiconductor chip 120a, the second semiconductor chip 120b, and the third semiconductor chip 120c according to some embodiments may be semiconductor chips having a same configuration.

According to some embodiments, the first semiconductor chip 120a to the third semiconductor chip 120c may be evenly stacked. In other words, assuming that the first semiconductor chip 120a to the third semiconductor chip 120c are a semiconductor chip of a same size, the first semiconductor chip 120a to the third semiconductor chip 120c may be stacked in the vertical direction. In other words, the first chip pad 130a of the first semiconductor chip 120a may vertically overlap the second semiconductor chip 120b and the third semiconductor chip 120c. In addition, the second chip pad 130b of the second semiconductor chip 120b may vertically overlap the first semiconductor chip 120a and the third semiconductor chip 120c. Further, the third chip pad 130c of the third semiconductor chip 120c may vertically overlap the first semiconductor chip 120a and the second semiconductor chip 120b.

Figure 6:
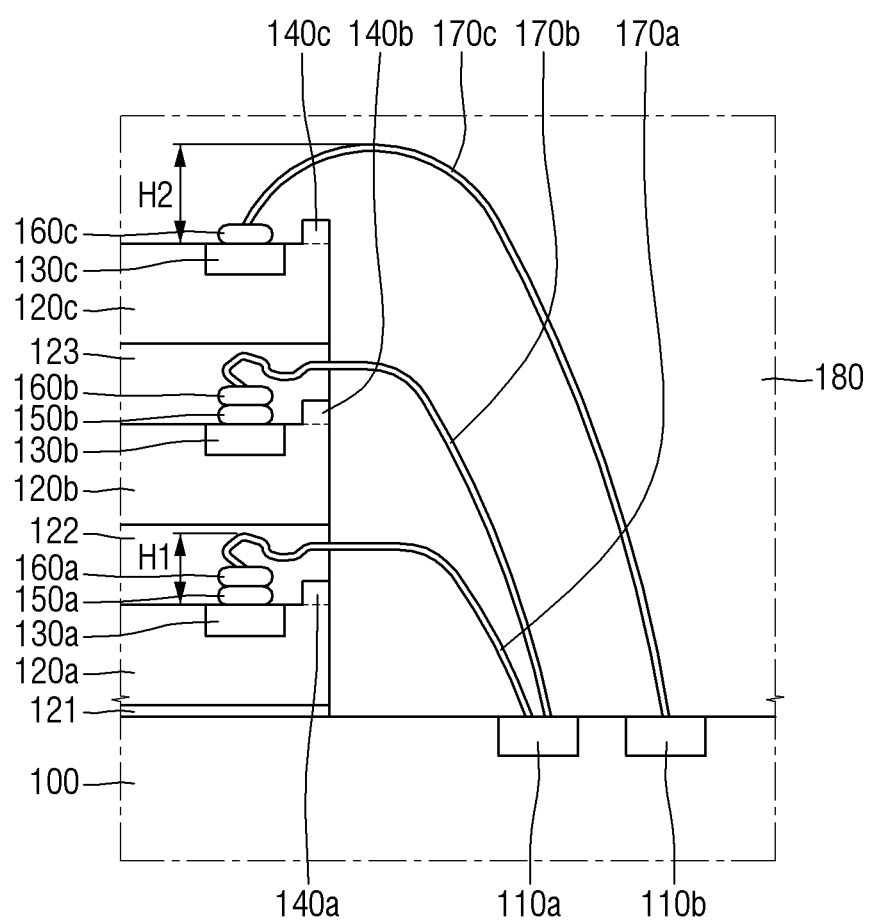
FIG. 6 is an exemplary diagram for illustrating a semiconductor package according to some embodiments.

FIG. 6 is an exemplary diagram for illustrating a semiconductor package according to some embodiments.

Referring to FIG. 6, the semiconductor package according to some embodiments may include a mounting substrate 100, a first semiconductor chip 120a, a second semiconductor chip 120b, a third semiconductor chip 120c, a first spacer ball 150a, a second spacer ball 150b, a first bump ball 160a, a second bump ball 160b, a third bump ball 160c, a first wire 170a, a second wire 170b, a third wire 170c, a first adhesive film 121, a second adhesive film 122, a third adhesive film 123, and a molding resin 180.

Each constituent element illustrated in FIG. 6 may be similar to those of FIGS. 1 and 5 described above. Therefore, repeated descriptions will be omitted or briefly explained.

According to some embodiments, the mounting substrate 100 may include a first bonding pad 110a and a second bonding pad 110b. The first bonding pad 110a and the second bonding pad 110b may be electrically connected to external terminals connected to an external device, respectively. For example, the first bonding pad 110a is electrically connected to a first solder ball (not illustrated), and the second bonding pad 110b may be electrically connected to a second solder ball (not illustrated). Alternatively, the first bonding pad 110a and the second bonding pad 110b may be, for example, ground pads, and may be electrically connected to ground lines in the mounting substrate 100. The first bonding pad 110a and the second bonding pad 110b are, for example, illustrated as being arranged in an outer shell of the mounting substrate 100, but the embodiments are not limited thereto.

According to some embodiments, the first semiconductor chip 120a and the second semiconductor chip 120b may be connected to the first bonding pad 110a. Further, the third semiconductor chip 120c may be connected to the second bonding pad 110b. According to some embodiments, the first semiconductor chip 120a and the second semiconductor chip 120b may be semiconductor chips of a same configuration, and the first semiconductor chip 120a and the third semiconductor chip 120c may be semiconductor chips of different configurations. However, the embodiments are not limited thereto.

FIG. 6 illustrates a configuration in which the first semiconductor chip 120a and the second semiconductor chip 120b are connected to the first bonding pad 110a, and the third semiconductor chip 120c is connected to the second semiconductor chip 120b, but the embodiments are not limited thereto. For example, the first semiconductor chip 120a is connected to the first bonding pad 110a, and the second semiconductor chip 120b and the third semiconductor chip 120c may be connected to the second bonding pad 110b. Those having ordinary skill in the technical field of the inventive concept may implement a semiconductor package including semiconductor chips having various arrangements.

Figure 7:
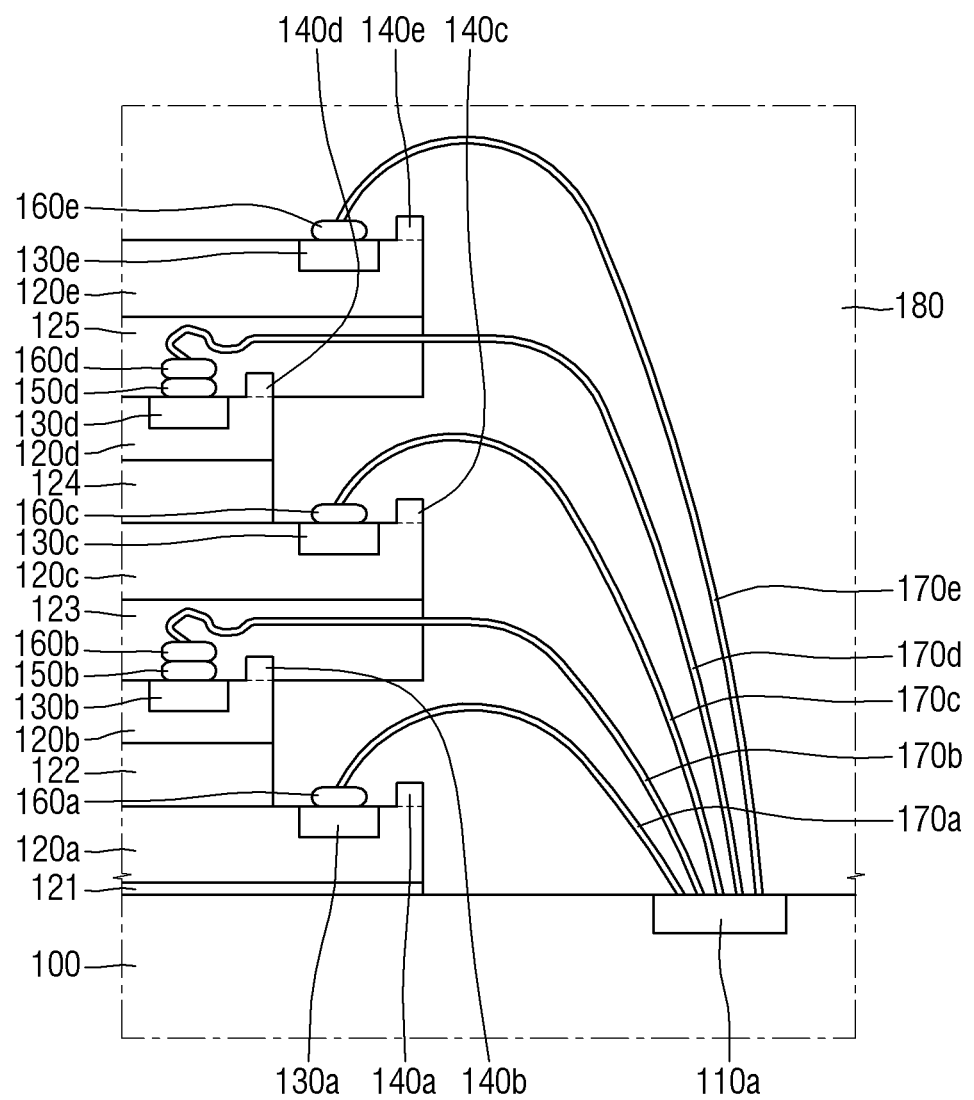
FIG. 7 is an exemplary diagram for illustrating a semiconductor package according to some embodiments.

FIG. 7 is an exemplary diagram for illustrating a semiconductor package according to some embodiments.

Referring to FIG. 7, the semiconductor package according to some embodiments may include a mounting substrate 100, a first semiconductor chip 120a, a second semiconductor chip 120b, a third semiconductor chip 120c, a fourth semiconductor chip 120d, a fifth semiconductor chip 120e, a second spacer ball 150b, a fourth spacer ball 150d, a first bump ball 160a, a second bump ball 160b, a third bump ball 160c, a fourth bump ball 160d, a fifth bump ball 160e, a first wire 170a, a second wire 170b, a third wire 170c, a fourth wire 170d, a fifth wire 170e, a first adhesive film 121, a second adhesive film 122, a third adhesive film 123, a fourth adhesive film 124, a fifth adhesive film 125, and a molding resin 180.

Each constituent element illustrated in FIG. 6 may be similar to those of FIGS. 1, 5, and 6 described above. Therefore, repeated descriptions will be omitted or briefly explained.

According to some embodiments, the first semiconductor chip 120a may be disposed on the mounting substrate 100. The mounting substrate 100 and the first semiconductor chip 120a may be attached to each other via the first adhesive film 121. The second semiconductor chip 120b may be disposed on the first semiconductor chip 120a. The first semiconductor chip 120a and the second semiconductor chip 120b may be attached to each other via the second adhesive film 122. The third semiconductor chip 120c may be disposed on the second semiconductor chip 120b. The second semiconductor chip 120b and the third semiconductor chip 120c may be attached to each other via the third adhesive film 123. The fourth semiconductor chip 120d may be disposed on the third semiconductor chip 120c. The third semiconductor chip 120c and the fourth semiconductor chip 120d may be attached to each other via the fourth adhesive film 124. The fifth semiconductor chip 120e may be disposed on the fourth semiconductor chip 120d. The fourth semiconductor chip 120d and the fifth semiconductor chip 120e may be attached to each other via the fifth adhesive film 125.

The first semiconductor chip 120a to the fifth semiconductor chip 120e may be stacked in a zigzag form. In other words, the first chip pad 130a of the first semiconductor chip 120a and the third chip pad 130c of the third semiconductor chip 120c may not be in contact with the second adhesive film 122 and the fourth adhesive film 124, respectively. However, the second chip pad 130b of the second semiconductor chip 120b and the fourth chip pad 130d of the fourth semiconductor chip 120d may be in contact with the third adhesive film 123 and the fifth adhesive film 125, respectively.

In other words, the first chip pad 130a of the first semiconductor chip 120a, the third chip pad 130c of the third semiconductor chip 120c, and the fifth chip pad 130e of the fifth semiconductor chip 120e may not vertically overlap the second semiconductor chip 120b and the fourth semiconductor chip 120d. Further, the second chip pad 130b of the second semiconductor chip 120b and the fourth chip pad 130d of the fourth semiconductor chip 120d may overlap the first semiconductor chip 120a, the third semiconductor chip 120c, and the fifth semiconductor chip 120e in the vertical direction.

According to some embodiments, the first bump ball 160a, the second bump ball 160b, and the third bump ball 160c may be directly connected to the first chip pad 120a of the first semiconductor chip 130a, the third chip pad 130c of the third semiconductor chip 120c, and the fifth chip pad 130e of the fifth semiconductor chip 120e, respectively. In other words, a spacer ball may not be separately connected to the top of the first semiconductor chip 120a, the third semiconductor chip 120c, and the fifth semiconductor chip 120e.

The first wire 170a, the third wire 170c, and the fifth wire 170e may be connected to the first bump ball 160a, the third bump ball 160c, and the fifth bump ball 160e, respectively. Since the first chip pad 130a of the first semiconductor chip 120a and the second semiconductor chip 120b do not overlap in the vertical direction, the first wire 170a may be formed as a normal loop. In other words, since the first chip pad 130a of the first semiconductor chip 120a has a sufficient height for forming a normal loop at the top thereof, the first wire 170a may be formed as a normal loop. Likewise, the third wire 170c and the fifth wire 170e may be formed as a normal loop.

According to some embodiments, the second spacer ball 150b and the fourth spacer ball 150d may be arranged on the second chip pad 130b of the second semiconductor chip 120b and the fourth chip pad 130d of the fourth semiconductor chip 120d, respectively. Further, the second spacer ball 150b and the fourth spacer ball 150d may be connected to the second bump ball 160b and the fourth bump ball 160d, respectively.

The second wire 170b and the fourth wire 170d may be connected to the second bump ball 160b and the fourth bump ball 160d, respectively. Since the second chip pad 130b of the second semiconductor chip 120b and the third semiconductor chip 120c overlap in the vertical direction, the second wire 170b may be formed as a folded loop having a hook shape. In other words, since the second chip pad 130b of the second semiconductor chip 120b does not have a sufficient height to form a normal loop at the top, the second wire 170b may be formed as a folded loop. Similarly, the fourth wire 170d may be formed as a folded loop having a hook shape.

Even though FIG. 7 illustrates that both the first wire 170a to the fifth wire 170e are connected to the first bonding pad 110a, the embodiments are not limited thereto. For example, at least one of the first wire 170a to the fifth wire 170e may be connected to a bonding pad different from the first bonding pad 110a.

FIGS. 8 to 16 are intermediate stage diagrams for explaining a method of fabricating a semiconductor package according to some embodiments. Repeated or similar descriptions in view of the above embodiments will be omitted or briefly explained.

Figure 8:
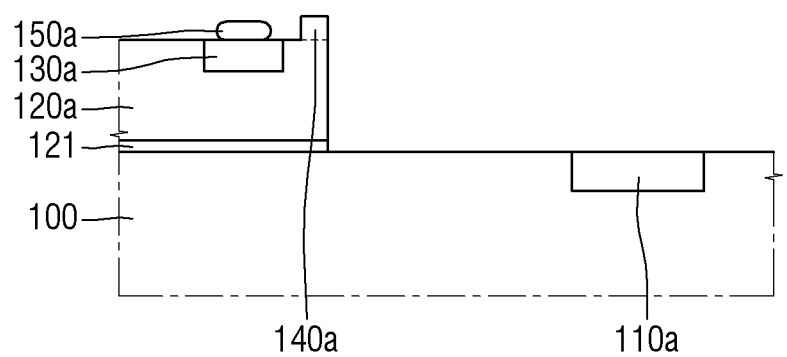
FIGS. 8 to 16 are intermediate stage diagrams for explaining a method of fabricating a semiconductor package according to some embodiments.

Referring to FIG. 8, the first semiconductor chip 120a is disposed on the mounting substrate 100. The first semiconductor chip 120a may be attached to the mounting substrate 100 by the first adhesive film 121. Subsequently, the first spacer ball 150a having an appropriate size (for example, so that a first wire 170a to be formed on the first spacer ball 150a does not come into contact with the first protrusion 140a of the first semiconductor chip 120a and the second semiconductor chip 120b) is formed on the first chip pad 130a of the first semiconductor chip 120a. A person having ordinary knowledge in the technical field of the inventive concept may change the size of the first spacer ball 150a as necessary.

Figure 9:
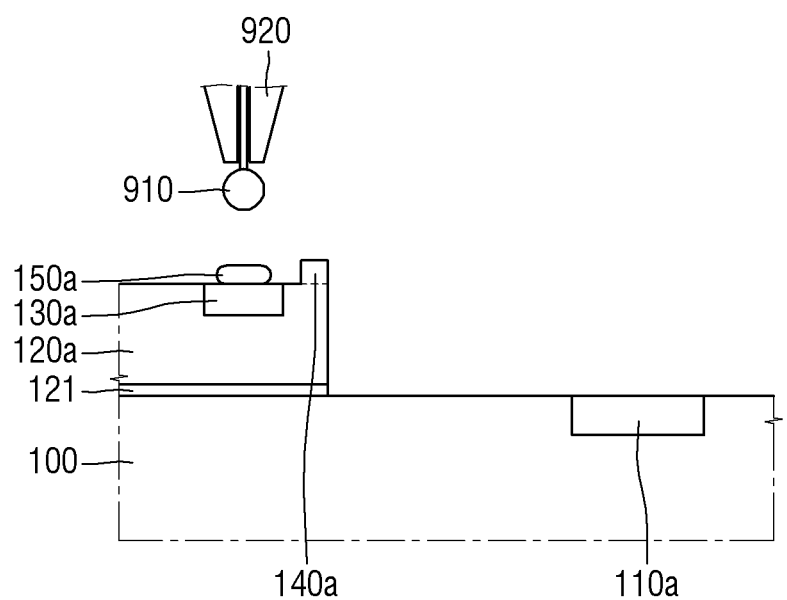
Figure 10:
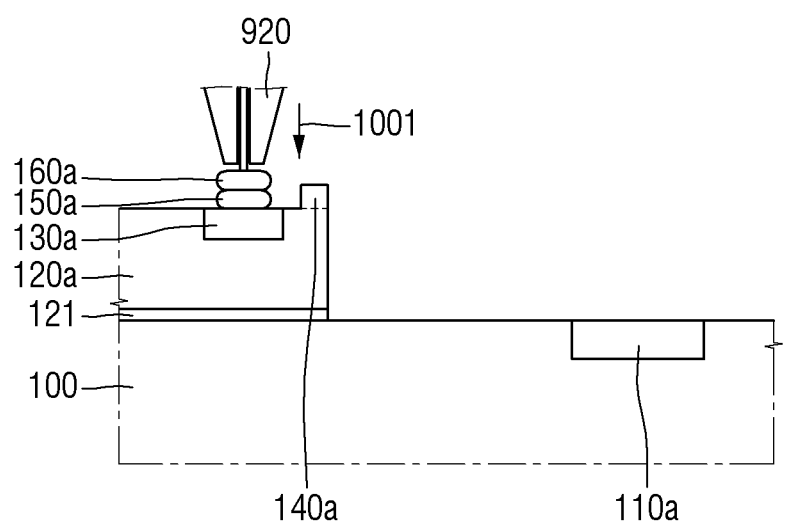

Referring to FIGS. 9 and 10, a capillary 920 may form a first free air ball (FAB) 910. By moving the capillary 920 in a first direction 1001 to press the first free air ball 910, the first bump ball 160a may be formed on the first spacer ball 150a.

Figure 11:
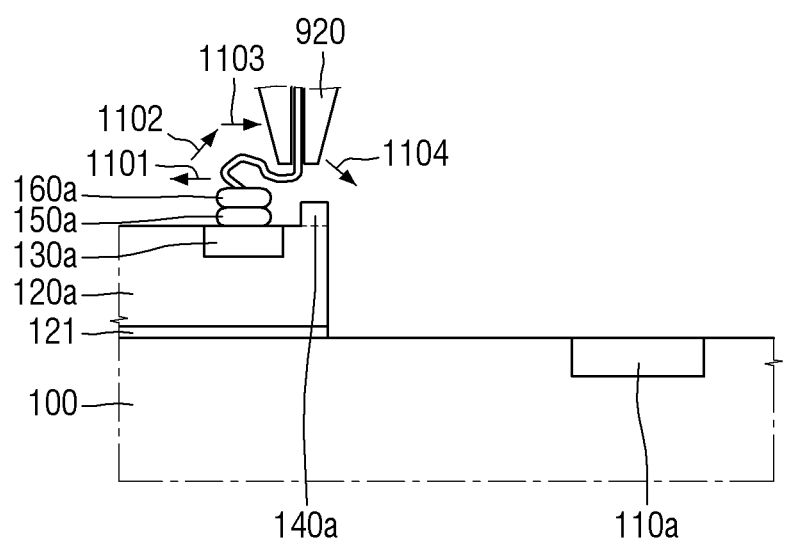
Figure 12:
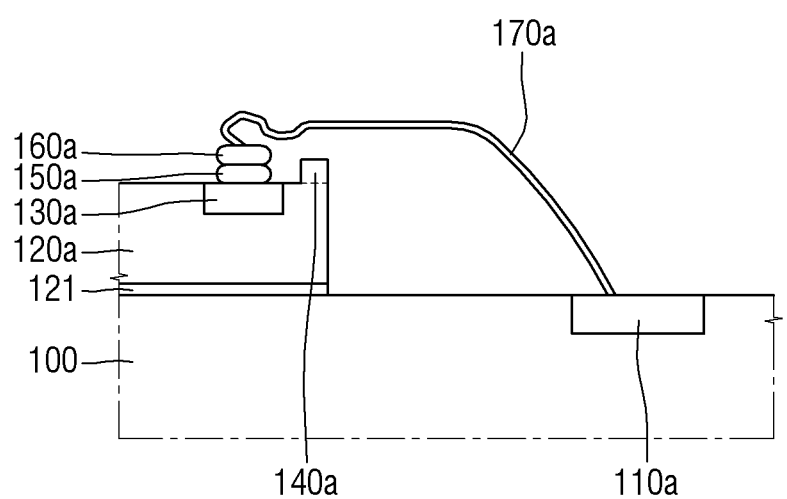

Referring to FIGS. 11 and 12, by moving the capillary 920 in a second direction 1101 away from the first bonding pad 110a, a first portion (170a1 of FIG. 4) of the first wire 170a may be formed. Subsequently, by moving the capillary 920 in a third direction 1102, a fourth direction 1103 and a fifth direction 1104 approaching the first bonding pad 110a, a second portion (170a2 of FIG. 4) of the first wire 170a may be formed. That is, a folded loop having a hook shape may be formed through the processes of FIGS. 9 to 12.

Figure 13:
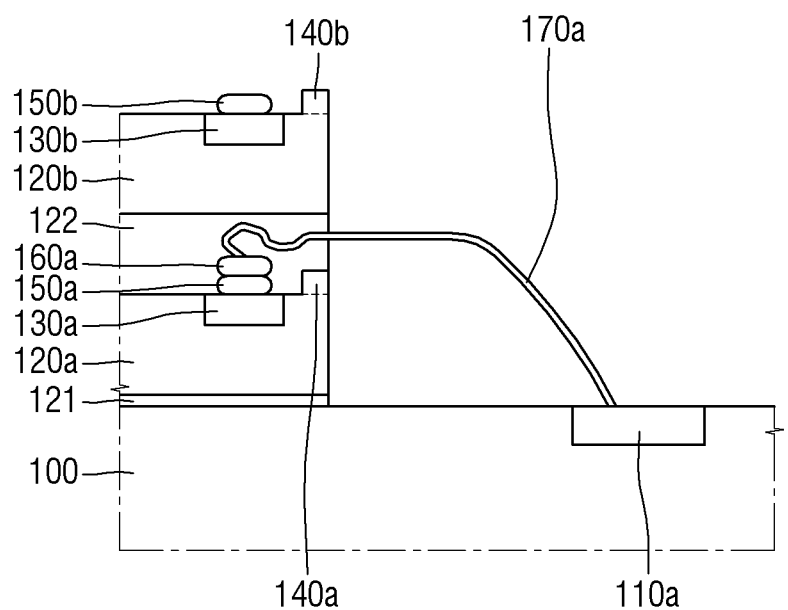

Referring to FIG. 13, the second semiconductor chip 120b is disposed on the first semiconductor chip 120a. The second semiconductor chip 120b may be attached to the first semiconductor chip 120a by the second adhesive film 122. Subsequently, a second spacer ball 150b having an appropriate size is formed on the second chip pad 130b of the second semiconductor chip 120b. A person having ordinary knowledge in the technical field of the inventive concept may change the size of the second spacer ball 150b as necessary.

Figure 14:
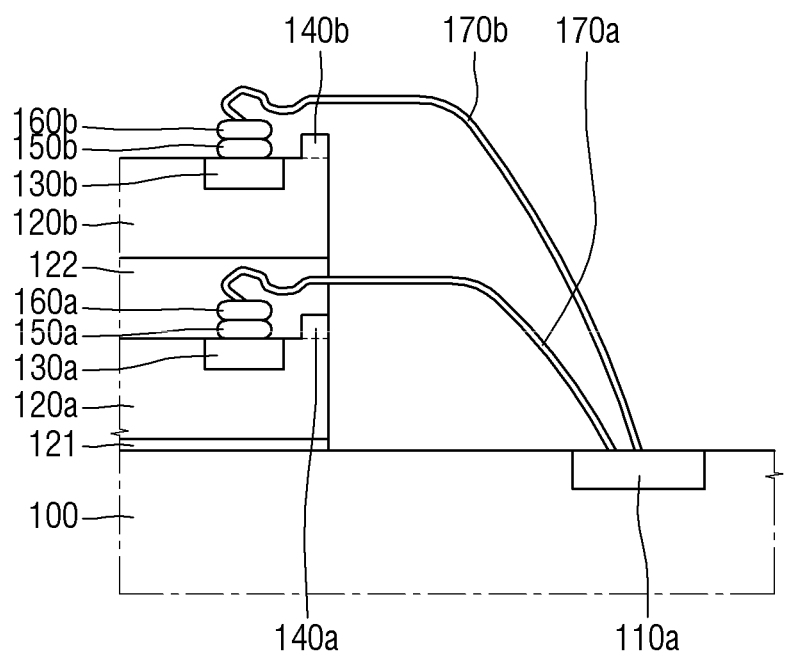

Referring to FIG. 14, a second bump ball 160b and a second wire 170b are formed in a manner similar to the method described above. In some embodiments, the second wire 170b may be formed as a folded loop having a hook shape.

Figure 15:
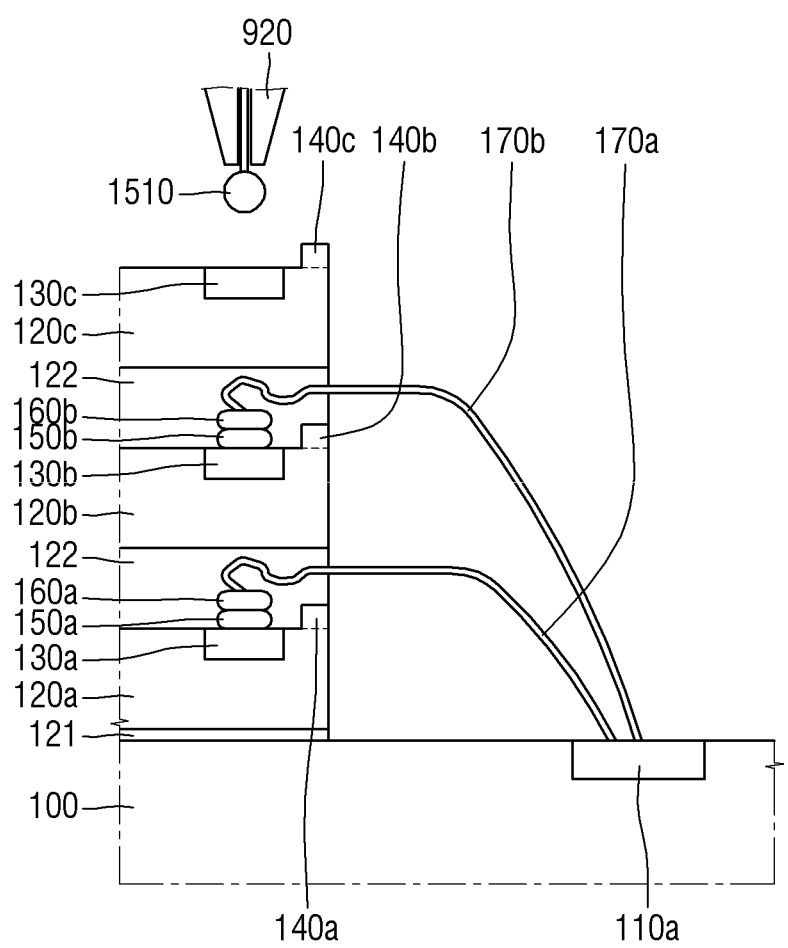
Figure 16:
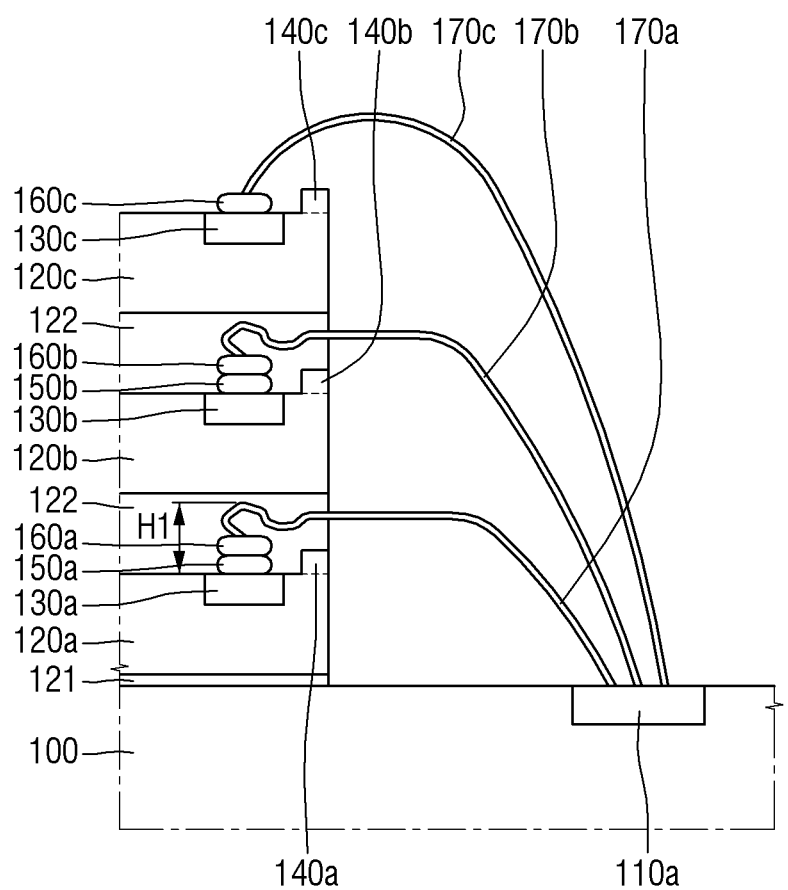

Referring to FIGS. 15 and 16, the third semiconductor chip 120c is disposed on the second semiconductor chip 120b. The third semiconductor chip 120c may be attached to the second semiconductor chip 120b by the second adhesive film 122. Unlike the first semiconductor chip 120a and the second semiconductor chip 120b, no spacer ball is formed on the third chip pad 130c of the third semiconductor chip 120c. After the capillary 920 forms the second free air ball 1510 and presses the second free air ball 1510 against the third chip pad 130c of the third semiconductor chip 120c to form the third bump ball 160c, a wire is formed in a direction approaching the first bonding pad 110a to form a third wire 170c. In some embodiments, the third wire 170c may be formed as a normal loop. Even though FIGS. 15 and 16 illustrate that the third wire 170c which is the normal loop is formed as a forward loop, the embodiments are not limited thereto.

Thereafter, the semiconductor package of FIG. 5 is fabricated by filling the molding resin 180 on the mounting substrate 10, and the first semiconductor chip 120a to the third semiconductor chip 120c.

Although the method of fabricating the semiconductor package of FIG. 5 has been described with reference to FIGS. 8 to 16, the embodiments are not limited thereto. Those having ordinary skill in the technical field of the inventive concept will be able to fabricate the semiconductor package including the technical idea of the inventive concept by adding, changing or deleting a specific procedure as necessary.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims. It is therefore desired that the above-described embodiments be considered in all respects as illustrative and not restrictive, reference being made to the appended claims rather than the foregoing description to indicate the scope of the invention.

What is claimed is:

1. A semiconductor package comprising:
   a mounting substrate comprising at least one bonding pad;
   a first semiconductor chip disposed on the mounting substrate, and comprising a first protrusion on one side of the first semiconductor chip;
   a first spacer ball electrically connected to the first semiconductor chip;
   a first bump ball electrically connected to the first spacer ball; and
   a first wire which electrically connects the first bump ball and the bonding pad without contacting the first protrusion,
   wherein the first wire comprises a first portion extending in a direction away from the bonding pad, and a second portion extending in a direction approaching the bonding pad.

2. The semiconductor package of claim 1, wherein the first semiconductor chip comprises a first chip pad electrically connected to the first spacer ball.

3. The semiconductor package of claim 1, further comprising:
   a second semiconductor chip disposed on the first semiconductor chip, and comprising a second protrusion on one side of the second semiconductor chip;

a second bump ball directly connected to the first semiconductor chip; and
a second wire which electrically connects the second bump ball and the mounting substrate without contacting the second protrusion.

4. The semiconductor package of claim 3, wherein the second bump ball is electrically connected to the bonding pad.

5. The semiconductor package of claim 4, wherein the first semiconductor chip and the second semiconductor chip have a same structure.

6. The semiconductor package of claim 3, wherein the bonding pad comprises a first bonding pad and a second bonding pad, and
wherein the second bump ball is electrically connected to the second bonding pad.

7. The semiconductor package of claim 6, wherein the first semiconductor chip and the second semiconductor chip have different structures.

8. The semiconductor package of claim 3, wherein the second wire does not extend in the direction away from the bonding pad.

9. The semiconductor package of claim 1, further comprising a molding resin which covers the first semiconductor chip and the mounting substrate.

10. A semiconductor package comprising:
at least one bonding pad;
a first semiconductor chip comprising a first chip pad connected to the bonding pad, and a first protrusion protruding from an upper surface of the first chip pad;
a first spacer ball on the first chip pad;
a first bump ball on the first spacer ball;
a first wire which connects the first bump ball and the bonding pad without contacting the first protrusion;
a second semiconductor chip disposed on the first semiconductor chip, and comprising a second chip pad connected to the bonding pad, and a second protrusion protruding from an upper surface of the second chip pad;
a second bump ball directly connected to the second chip pad; and
a second wire which connects the second bump ball and the bonding pad without contacting the second protrusion,
wherein the first wire comprises a first portion extending in a direction away from the bonding pad, and a second portion extending in a direction approaching the bonding pad, and
wherein the second wire does not extend in the direction away from the bonding pad.

11. The semiconductor package of claim 10, further comprising:
a third semiconductor chip comprising a third chip pad connected to the bonding pad, and a third protrusion protruding from an upper surface of the third chip pad;
a second spacer ball on the third chip pad;
a third bump ball on the second spacer ball; and
a third wire which connects the third bump ball and the bonding pad without contacting the third protrusion,
wherein the third semiconductor chip is disposed between the first semiconductor chip and the second semiconductor chip, and
wherein the third wire comprises a third portion extending in a direction away from the bonding pad, and a fourth portion extending in a direction approaching the bonding pad.

12. The semiconductor package of claim 11, wherein the bonding pad comprises a plurality of bonding pads, and
wherein each of the first to third wires is connected to at least one of the bonding pads.

13. The semiconductor package of claim 12, wherein the first to third semiconductor chips have a same structure.

14. The semiconductor package of claim 12, wherein one or two of the first to third wires are connected to one of the bonding pads, and a remaining one or two of the first to third wires are connected to another of the bonding pads.

15. The semiconductor package of claim 11, wherein the first and second semiconductor chips have a same structure, and
wherein a structure of the third semiconductor chip is different from a structure of the first semiconductor chip.

16. The semiconductor package of claim 10, further comprising an adhesive film disposed between the first semiconductor chip and the second semiconductor chip.

17. The semiconductor package of claim 10, further comprising a molding resin which covers the first and second semiconductor chips.

18. A semiconductor package comprising:
a mounting substrate comprising at least one bonding pad;
a first semiconductor chip disposed on the mounting substrate, and comprising a first chip pad and a first protrusion protruding from the first chip pad;
a second semiconductor chip disposed on the first semiconductor chip, and comprising a second chip pad and a second protrusion protruding from the second chip pad;
a third semiconductor chip disposed on the second semiconductor chip, and comprising a third chip pad and a third protrusion protruding from the third chip pad; and
a first wire, a second wire and a third wire connecting of the first to third chip pads to the bonding pad, respectively,
wherein the second wire is connected to the second chip pad by a second spacer ball disposed on the second chip pad and a second bump ball disposed on the second spacer ball,
wherein the first chip pad and the third chip pad do not overlap the second semiconductor chip in a vertical direction,
wherein the second chip pad overlaps the first semiconductor chip and the third semiconductor chip in the vertical direction, and
wherein the second wire includes a first portion extending in a direction away from the bonding pad, and a second portion extending in a direction approaching the bonding pad.

19. The semiconductor package of claim 18, wherein the first wire does not extend in the direction away from the bonding pad, and
wherein the third wire does not extend in the direction away from the bonding pad.

20. The semiconductor package of claim 18, further comprising:
a first bump ball directly connected to the first chip pad and the first wire; and
a third bump ball directly connected to the third chip pad and the third wire.

* * * * *